United States Patent
Onoda et al.

[11] Patent Number: 5,926,374
[45] Date of Patent: Jul. 20, 1999

[54] IC CARD

[75] Inventors: Shigeo Onoda; Tomomi Morii; Kiyotaka Nishino, all of Tokyo, Japan

[73] Assignee: Mitsubishi Denki Kabushiki Kaisha, Tokyo, Japan

[21] Appl. No.: 09/061,869

[22] Filed: Apr. 17, 1998

Related U.S. Application Data

[30] Foreign Application Priority Data

Nov. 17, 1997 [JP] Japan ..................... 9-314987

[51] Int. Cl.$^6$ .............. H05K 1/14; B65D 85/86
[52] U.S. Cl. ............ 361/737; 361/752; 361/796; 206/706
[58] Field of Search .................. 361/736, 737, 361/752, 796, 800, 756, 759; 174/35 R, 35 GC; 439/76.1; 211/41.17; 257/679; 235/492; 206/706

[56] References Cited

U.S. PATENT DOCUMENTS 5,493,477  2/1996  Hirai ....................... 361/737
5,572,408  11/1996  Anhalt et al. ............ 361/737

FOREIGN PATENT DOCUMENTS

1-146794  6/1989  Japan .
3-045397  2/1991  Japan .
7-160837  6/1995  Japan .

*Primary Examiner*—Leo P. Picard
*Assistant Examiner*—Jayprakash N. Gandhi

[57] ABSTRACT

There is provided an IC card where a pair of, upper and lower metal panels are respectively fixed to the frame; edge portions of the metal panel are provided with bend portions; grooves each of which comprises a pair of uneven vertical walls having a plurality of depressions and projections extending in the direction of the width of the frame are provided on the top and bottom surfaces of the frame; the distance between the projections on both the uneven vertical walls in the direction of the width of the frame is set so as to be smaller than the thickness of the bend portions by a given amount; and the metal panel is fixed to the frame with the bend portions press-fitted into the grooves along the projections. The IC card is advantageous in the manufacturing cost and is capable of stably providing a fixing force sufficient to withstand a long-term use, with regard to the fixation of upper and lower panel members to a frame.

13 Claims, 9 Drawing Sheets

IC CARD

BACKGROUND OF THE INVENTION

1. Field of the Invention

The present invention relates to an IC card in which a pair of panel members are fixed onto the top and bottom surfaces, respectively, of the frame of the card.

2. Description of the Prior Art

Conventionally, for so-called IC cards has been generally and widely employed a structure in which the inner components such as electric circuit boards having specific electronic parts and the like incorporated therein are disposed in a resin frame of which the top and bottom surfaces are covered by a pair of metal panels.

Herein, "IC Card" means a card-like or plate-like apparatus which comprises electric circuits or electronic circuits including semi-conductor circuits, and such cards include cards which are identified by other various names such as PC card, modem card, LAN card, memory card, or electronic card and which have the similar basic arrangement.

There has been known an example of a structure of such an IC card (hereinafter referred to as a prior art 1) in which upper and lower metal panels are joined to a unitary frame body with use of adhesive sheets.

As shown in FIGS. 15–20 as an example of such an IC card according to the prior art 1, an IC card 101 is assembled as follows: A module in which a connector 106 is mounted to one end of an electric circuit board 104 having specific electronic parts and the like 105 incorporated therein is incorporated into a unitary resin frame 102. Adhesive sheets 109 having adhesive applied to both surfaces thereof are temporarily bonded to, for example, the upper and lower surfaces of the frame 102, respectively. Upper and lower metal panels 107, 108 are then integrated with the upper and lower sides of the frame 102 through the medium of the adhesive sheets 109, and are heated under a predetermined temperature condition while being pressed from above and below, so that the metal panels 107, 108 are bonded and fixed to the upper and lower sides of the frame 102.

In the example shown in FIGS. 15–20, the upper and lower metal panels 107 and 108 are provided with bend portions 107b and 108b, respectively, which are formed of edge portions of the panels bent generally by 90 degrees. On the other hand, grooves 102g having a larger width than the thickness of the bend portions 107b, 108b are provided on the upper and lower sides of the frame 102 along edges of the frame 102. When the upper and lower metal panels 107 and 108 are integrated with the upper and lower sides of the frame 102, respectively, the bend portions 107b, 108b are fitted into the grooves 102g on the upper and lower sides of the frame 102.

Also, Japanese Patent Laid-Open Publication HEI 1-146794 (hereinafter referred to as a prior art 2) discloses another example of such a card structure in which the enlargement of the area to be bonded and the reinforcement of the adhesion are achieved by bent portions provided on the circumferences or part of the upper and lower metal panels, and in which the card is assembled by fitting the bent portions into grooves provided on the frame.

Further, Japanese Patent Laid-Open Publication HEI 3-45397 (hereinafter referred to as a prior art 3) discloses such a card structure in which projections are formed on the extremities of bent portions formed on both longitudinal sides of upper and lower metal panels and in which the projections are press-fitted along guide grooves provided on the frame.

Furthermore, Japanese Patent Laid-Open Publication HEI 7-160837 (hereinafter referred to as a prior art 4) discloses such a card structure in which, with use of a case wherein a frame and one panel are integrated, and with a plurality of elastic tongues provided on the other panel, the tongues are fitted into and engaged with grooves provided on the case, by the action of the elasticity of the tongues.

The prior arts mentioned above, however, have their respective drawbacks as follows:

In the prior art 1, the adhesive sheets 109 required to bond and fix the metal panels 107, 108 to the frame 102 cost much particularly because each adhesive sheet 109 has to be shaped like a frame corresponding to the shape of the plan view of the frame 102. Besides, the assemblage of the card requires specialized apparatus and a lot of labor because the obtainment of a required adhesion from the adhesive on the adhesive sheets requires a predetermined temperature (e.g., 150 degrees C) to be maintained and a predetermined pressure (e.g., about 50 kg) to be applied in the assembling process. Additionally, it is generally difficult to achieve a uniform adhesion throughout the peripheries of the metal panels 107, 108 to obtain a stable fixing force, especially because each adhesive sheet 109 is shaped like a frame.

Also, in the prior art 2, the metal panels are fixed to the frame basically by the adhesion, and it is therefore difficult to stably obtain a uniform fixing force along the bent portions, even though the bent portions are provided on most of the peripheries of the metal panels.

Further, in the prior art 3, the extremities of the projections provided on the bent portions of the metal panels are simply press-fitted into the guide grooves on the frame and, as it were, the metal panels and the frame are in point engagement with each other, so that it is difficult to stably obtain a fixing force sufficient to withstand a long-term use. Besides, it is generally difficult to ensure a stable strength, especially because the projections are provided on the extremities of the bent portions.

Furthermore, in the prior art 4, the panels are engaged with the grooves on the case simply by the action of the elasticity of the plurality of tongues, and it is therefore difficult to stably obtain a fixing force sufficient to withstand a long-term use.

For the purpose of avoiding the application of adhesive where possible and fixing the metal panels to the frame basically only with press-fitting force, a method is known in which projections provided on the metal panels are press-fitted into grooves formed on the frame, e.g., as shown in the prior art 3. In this method, it may be possible to obtain a force fixing the panels to the frame, by the press-fit effect of the projections which acts in their longitudinal directions, with a setting in which the width of the grooves is greater than the thickness of the projections by not less than a certain degree so that the projections are made free in the directions of their thicknesses and in which the length of the grooves is smaller than the length of the projections by a given amount. In this arrangement, however, the fixing force acts only at both ends of each projection, thus resulting in point engagement, as it were; it is therefore difficult to stably obtain a fixing force sufficient to withstand a long-term use.

It may also be possible to make such an arrangement as follows: The edge portions of each metal panel are bent generally by 90 degrees over almost all the lengths of the portions to form bent portions (bend portions), and the frame is provided with grooves which have a width smaller than the thickness of the bend portions by a given amount (a slight amount as press-fit margin) and which extend rectilinearly along the frame. The bend portions are press-fitted into the grooves so that a firm fixing force can be obtained by the press-fit effect of the bend portions which acts in the directions of their thicknesses.

The thickness of the metal panels, however, is so small (e.g., on the order of 0.15 mm) that the press-fit margin for producing the press-fit effect in the direction of the thickness of the panels is extremely small. Accordingly, to form rectilinear grooves having the width corresponding to the margin over not less than a certain degree of length requires molding and/or machining with extremely high accuracy and is substantially impossible from the viewpoint of the technology of producing the frame, at least on the premise of not less than a certain degree of mass production.

SUMMARY OF THE INVENTION

The invention has been made in consideration of the above problems and is basically intended to provide an IC card which is advantageous in the manufacturing cost and which is capable of stably providing a fixing force sufficient to withstand a long-term use, with regard to the fixation of the upper and lower panel members to the frame.

Therefore, in a first aspect of the present invention, there is provided an IC card where a pair of, upper and lower panel members covering the plane portions of the card are respectively fixed to the upper and lower sides of a frame forming the exterior of the card, the IC card characterized in that: the panel members are provided with bend portions which are formed of edge portions of the panel members bent generally by 90 degrees; grooves each of which comprises a pair of uneven vertical walls having a plurality of depressions and projections extending in the direction of the width of the frame are provided along the frame on the top and bottom surfaces of the frame; the distance between the projections on both the uneven vertical walls in the direction of the width of the frame is set so as to be smaller than the thickness of the bend portions by a given amount; and the panel members are fixed to the frame by the press-fit of the bend portions into the grooves along the projections on the uneven vertical walls.

In accordance with the first aspect of the present invention, the grooves each of which comprises a pair of uneven vertical walls having a plurality of depressions and projections extending in the direction of the width of the frame are provided along the frame on the top and bottom surfaces of the frame. Additionally, the distance between the projections of both the uneven vertical walls in the direction of the width of the frame is set so as to be smaller than the thickness of the bend portions of the panel members by a given amount. The panel members are fixed to the frame by the press-fit of the bend portions along the projections on the uneven vertical walls, so that an extremely large fixing force can be obtained by the press-fit effect of the bend portions which acts in the directions of the thicknesses of the bend portions. Thus the panel members can be firmly fixed to the frame.

That is, the first aspect of the present invention does not require the bonding with use of the frame-like adhesive sheet 109 required for the prior art 1, and therefore provides a more stable fixing force with lower cost. Besides, a fixing force sufficient to withstand a long-term use can be stably obtained as compared with the prior arts 2 to 4 and with the case in which the fixation to the frame is achieved by the press-fit effect of the projections provided on the panel members, which effect acts in the directions of the lengths of the projections. In this arrangement, the press-fit margin in the direction of the thickness of the bend portions is defined by the distance between the projections of both the uneven vertical walls in the direction of the width of the frame, so that the frame can be produced more readily as compared with the case where the press-fit margin is defined by the width of rectilinear grooves extending along the frame and having not less than a certain degree of length.

Also, in a second aspect of the present invention, there is provided an IC card where a pair of, upper and lower panel members covering the plane portions of the card are respectively fixed to the upper and lower sides of a resin frame forming the exterior of the card, the IC card characterized in that: the panel members are provided with bend portions which are formed of edge portions of the panel members bent generally by 90 degrees; on the top and bottom surfaces of the frame are provided grooves each of which comprises an uneven vertical wall having a plurality of depressions and projections extending in the direction of the width of the frame, and comprises an even vertical wall extending in parallel with the frame, and which grooves extend along the frame; the distance between the projections on the uneven vertical wall and the even vertical wall is set so as to be smaller than the thickness of the bend portions by a given amount; and the panel members are fixed to the frame by the press-fit of the bend portions between the projections on the uneven vertical wall and the even vertical wall.

In accordance with the second aspect of the present invention, on the top and bottom surfaces of the frame are provided the grooves each comprising the uneven vertical wall having the plurality of depressions and projections extending in the direction of the width of the frame, and comprising the even (i.e., planar) vertical wall extending in parallel with the frame, which grooves extend along the frame. Besides, the distance between the projections on the uneven vertical wall and the even vertical wall is set so as to be smaller than the thickness of the bend portions of the panel members by a given amount. The panel members are fixed to the frame by the press-fit of the bend portions between the projections on the uneven vertical wall and the even vertical wall, so that an extremely large fixing force can be obtained by the press-fit effect of the bend portions which acts in the directions of the thicknesses of the bend portions. Thus the panel members can be firmly fixed to the frame.

That is, the second aspect of the present invention does not require the bonding with use of the frame-like adhesive sheet 109 required for the prior art 1, and therefore provides a more stable fixing force with lower cost. Besides, a fixing force sufficient to withstand a long-term use can be stably obtained as compared with the prior arts 2 to 4 and with the case in which the fixation to the frame is achieved by the press-fit effect of the projections provided on the panel members, which effect acts in the directions of the lengths of the projections. In this arrangement, the press-fit margin in the direction of the thickness of the bend portions is defined by the distance between the projections on the uneven vertical wall and the even vertical wall, so that the frame can be produced more readily as compared with the case where the press-fit margin is defined by the width of the rectilinear grooves extending along the frame and having not less than a certain degree of length.

Additionally, one vertical wall in the groove on the frame is even (planar), and positioning the even vertical wall on the outer side with respect to the frame avoids the unevenness of the gaps between the outsides of the bend portions and the grooves on the frame, in the IC card assembled by the press-fit of the bend portions of the panel members, and improves the appearance of the card. Furthermore, in the case of the frame made of resin, the production of the die of the frame can be facilitated as compared with the case where both the vertical walls in the grooves are uneven.

Further, in the above mentioned aspect of the present invention, it is prefered that each bend portion is formed so as to be uneven and so as to have depressions and projections extending in a direction orthogonal to the direction of the press-fit.

In this case, basically the same effects as in the above mentioned aspect of the present invention can be achieved. Moreover, each bend portion is formed so as to be uneven and so as to have the depressions and projections extending in the direction orthogonal to the direction of the press-fit, and this configuration is capable of producing the same effect as an increase in the thickness of the bend portion. Additionally, use can be made of the elastic force acting in the direction orthogonal to the direction of the press-fit of each bend portion, and thus the force for fixing the bend portions to the grooves on the frame can be further increased.

Furthermore, in the above mentioned aspect of the present invention, it is prefered that each bend portion is formed so as to be uneven and so as to have a plurality of depressions and projections extending in a direction orthogonal to the direction of the press-fit and ranging in the longitudinal direction of the bend portion.

In this case, basically the same effects as in the above mentioned aspect of the present invention can be achieved. Moreover, each bend portion is formed so as to be uneven and so as to have the plurality of depressions and projections extending in the direction orthogonal to the direction of the press-fit and ranging in the longitudinal direction of the bend portion, and the bend portion thus can be press-fitted into the groove on the frame smoothly and reliably with a smaller pressure.

Furthermore, in a third aspect of the present invention, there is provided an IC card where a pair of, upper and lower panel members covering the plane portions of the card are respectively fixed to the upper and lower sides of a resin frame forming the exterior of the card, the IC card characterized in that: the panel members are provided with bend portions which are formed of edge portions of the panel members bent generally by 90 degrees; on the top and bottom surfaces of the frame are provided grooves each comprising a pair of corrugated vertical walls having an amplitude in the direction of the width of the frame, which grooves extend along the frame; the distance between the tops of both the corrugated vertical walls in the direction of the width of the frame is set so as to be smaller than the thickness of the bend portions by a given amount; and the panel members are fixed to the frame by the press-fit of the bend portions into the grooves along the tops of the corrugated vertical walls.

In accordance with the third aspect of the present invention, on the top and bottom surfaces of the frame are provided the grooves each comprising the pair of corrugated vertical walls having the amplitude in the direction of the width of the frame, which grooves extend along the frame. Besides, the distance between the tops of both the corrugated vertical walls in the direction of the width of the frame is set so as to be smaller than the thickness of the bend portions of the panel members by a given amount. The panel members are fixed to the frame by the press-fit of the bend portions along the tops of the corrugated vertical walls, so that an extremely large fixing force can be obtained by the press-fit effect of the bend portions which acts in the directions of the thicknesses of the bend portions. Thus the panel members can be firmly fixed to the frame.

That is, the third aspect of the present invention does not require the bonding with use of the frame-like adhesive sheet 109 required for the prior art 1, and therefore provides a more stable fixing force with lower cost. Besides, a fixing force sufficient to withstand a long-term use can be stably obtained as compared with the prior arts 2 to 4 and with the case in which the fixation to the frame is achieved by the press-fit effect of the projections provided on the panel members, which effect acts in the directions of the lengths of the projections. In this arrangement, the press-fit margin in the direction of the thickness of the bend portions is defined by the distance between the tops of both the corrugated vertical walls in the grooves in the direction of the width of the frame, so that the frame can be produced more readily as compared with the case where the press-fit margin is defined by the width of rectilinear grooves extending along the frame and having not less than a certain degree of length.

In the case of the frame molded of resin, the die of the frame can be produced readily and the moldability can be improved as compared with the case where the vertical walls in the grooves are angular and uneven.

Furthermore, in the above mentioned aspect of the present invention, it is prefered that at least one surface of each bend portion of the panel members has surface properties of which the surface roughness is not less than a certain degree of roughness.

In this case, basically the same effects as in the above mentioned aspect of the present invention can be achieved. Moreover, at least one surface of each bend portion of the panel members preferably has surface properties of which the surface roughness is not less than a certain degree of roughness and the increase in frictional resistance resulted from the surface roughness provides a larger fixing force when the bend portions are press-fitted into the grooves.

Furthermore, in the above mentioned aspect of the present invention, it is prefered that the frame is made of resin and the bend portions of the panel members are press-fitted into and fixed to the frame by vibration press-fit method or ultrasonic press-fit method.

In this case, basically the same effects as in the above mentioned aspect of the present invention can be achieved. Moreover, the frame is made of resin and the bend portions of the panel members are press-fitted into and fixed to the frame by vibration press-fit method or ultrasonic press-fit method. With use of the vibration press-fit method or the ultrasonic press-fit method, the bend portions can be press-fitted into the grooves while part of resin which constitutes the vertical walls of the grooves on the frame is melted. As a result, the bend portions can be fixed to the grooves more reliably and more firmly.

DETAILED DESCRIPTION OF THE PREFERRED EMBODIMENTS

Embodiment 1

Figure 1:
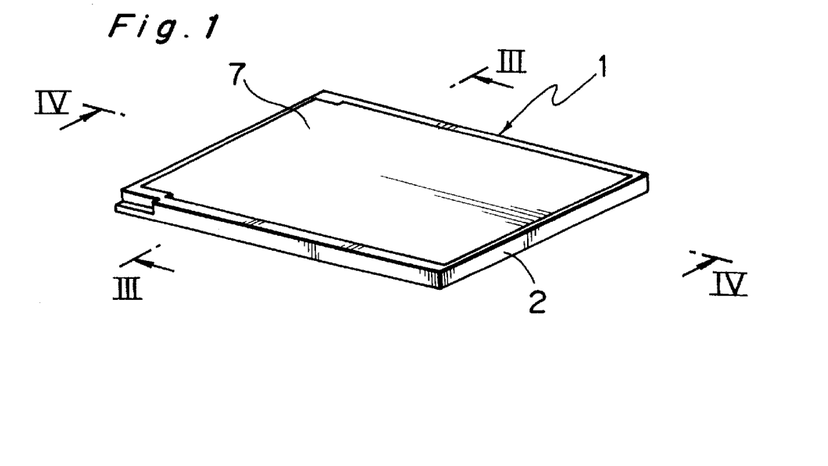
FIG. 1 is a perspective view illustrating an IC card in accordance with an embodiment 1 of the invention.
Figure 2:
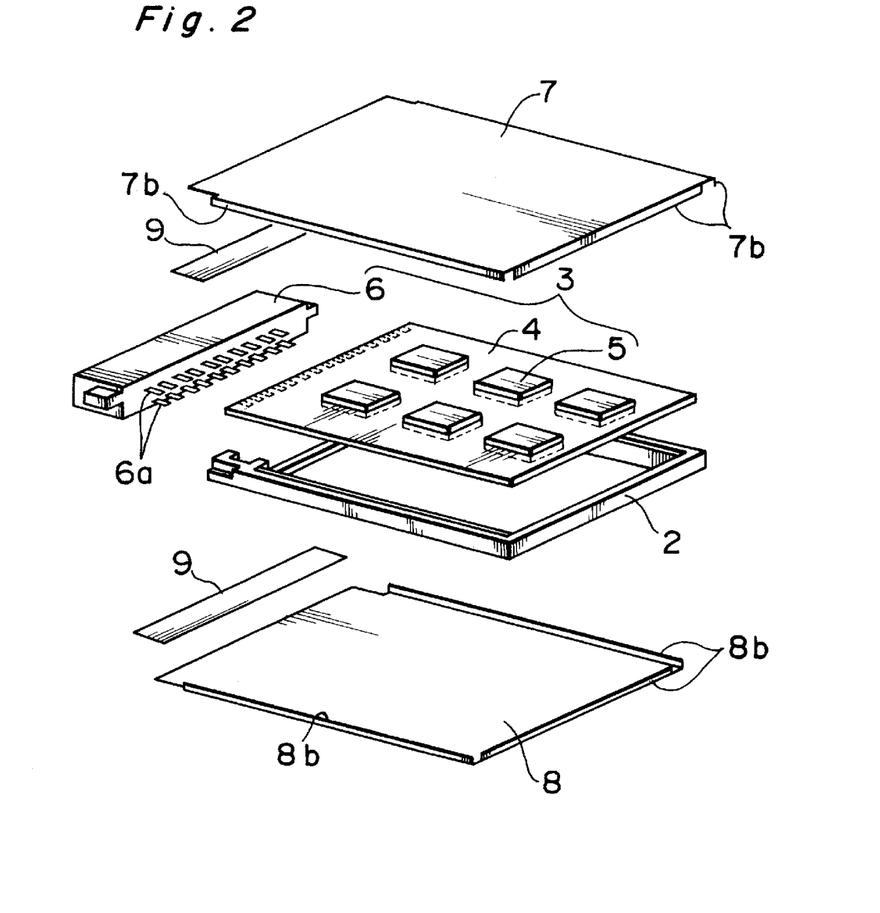
FIG. 2 is an exploded view in perspective illustrating the IC card in accordance with the embodiment 1.
Figure 3:
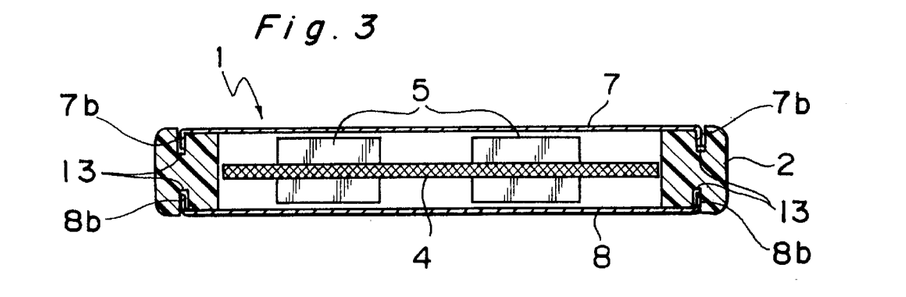
FIG. 3 is an illustrative section taken along the line III—III of FIG. 1.
Figure 4:
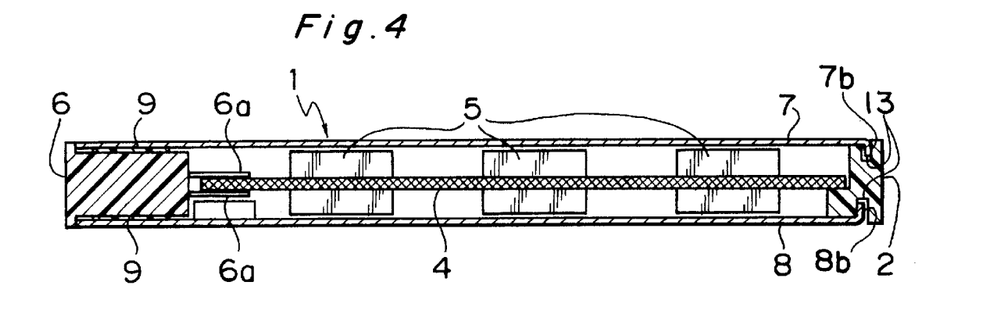
FIG. 4 is an illustrative section taken along the line IV—IV of FIG. 1.

Hereinafter, some embodiments of the invention will be described in detail referring to the appended drawings. FIG. 1 is a general perspective view illustrating an IC card 1 in accordance with an embodiment 1 of the invention; FIG. 2 is an exploded view in perspective illustrating the IC card 1; and FIGS. 3 and 4 are illustrative sections of the IC card 1.

As shown in these drawings, the IC card 1 comprises a frame 2 constituting the exterior of the card body, an electric circuit board 4 having specific electronic parts and the like 5 incorporated therein, a connector 6 mounted to one end of the electric circuit board 4, and a pair of metal panels 7, 8 respectively covering the upper and lower sides (the face and the back side) of the card 1 containing the electric circuit board 4 and the connector 6.

The connector 6 is to be electrically connected to equipment (such as a personal computer) for which the IC card 1 is used, for sending and receiving signals, and the connector is located on one side surface of the IC card 1 facing longitudinally (the front side surface). The electronic parts and the like 5 and the connector 6 are electrically and mechanically connected to the electric circuit board 4 by a technique such as soldering, and those components thereby constitute a module 3 as a sort of unit. The electric circuit board 4 and the connector 6 are connected to each other through a large number of metal conductors 6a. The frame 2 is formed as one piece by resin molding.

The IC card 1 is assembled by incorporating the module 3 into the frame 2 and then by fixing the metal panels 7, 8 to the upper and lower sides of the frame 2, respectively.

A structure for fixing the metal panels 7, 8 to the frame 2 will be described below.

The metal panels 7, 8 are provided with bend portions 7b, 8b which have been formed by bending the side edge portions extending longitudinally of the metal panels 7, 8 generally by 90 degrees and by bending the edge portions of the panels opposite to the connector 6 (i.e., the edge portions on the rear side) generally by 90 degrees. The metal panels 7, 8 have been produced by shearing and bending stainless steel plates having a thickness of about 0.15 mm.

At least one side (both sides, more preferably) of each bend portion 7b, 8b of the metal panels 7, 8 preferably has surface properties of which the surface roughness is not less than a certain degree of roughness. The surface roughness is preferably, e.g., on the order of 10 to 20 [$\mu$m] in maximum height. Such a surface roughness can be readily obtained, e.g., by sandblasting with use of sand particle having a given diameter or shotblasting with use of shots having a given particle diameter, which is performed at least on the portions corresponding to the bend portions 7b, 8b before the bending process for forming the bend portions 7b, 8b.

Grooves 13 into which the bend portions 7b, 8b are to be press-fitted are provided on the top and bottom surfaces of the frame 2 so as to extend along the frame 2. The depth of the grooves 13 is so set as to be greater than the height of the bend portions 7b, 8b. The grooves 13 are provided over the whole length of each part of the frame 2, corresponding to the lengths of the bend portions 7b, 8b.

On the top and bottom surfaces of the frame 2, plane portions which support the metal panels 7, 8 inside the grooves 13 have a height smaller than the portions outside the grooves 13 generally by the thickness of the metal panels 7, 8, so that the metal panels 7, 8 may not significantly project vertically from the outside portions of the frame 2 when the metal panels 7, 8 are fixed to the top and bottom surfaces of the frame 2, respectively.

As FIGS. 5 to 8 illustrate in detail a groove 13 provided on the top surface of the frame 2, each groove 13 provided on the top and bottom surfaces of the frame 2 comprises a pair of uneven vertical walls 14, 15 having a plurality of depressions 14a, 15a and projections 14b, 15b extending in the direction of the width of the frame, and comprises a bottom wall 16. It is to be noteid that the following description on the structure for fixing the upper metal panel 7 to the frame 2 can be applied to the structure for fixing the lower metal panel 8 to the frame 2.

Figure 5:
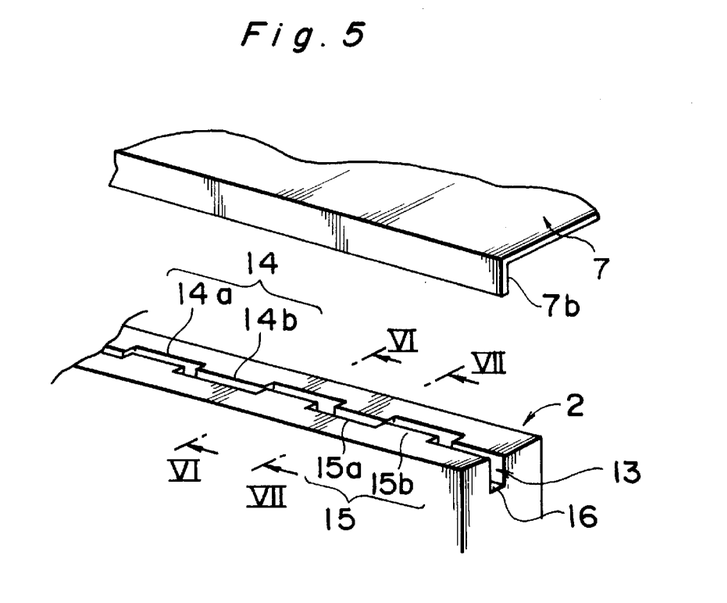
FIG. 5 is an enlarged perspective view illustrating the top surface of a frame and a bend portion of an upper metal panel in the IC card in accordance with the embodiment 1.
Figure 6:
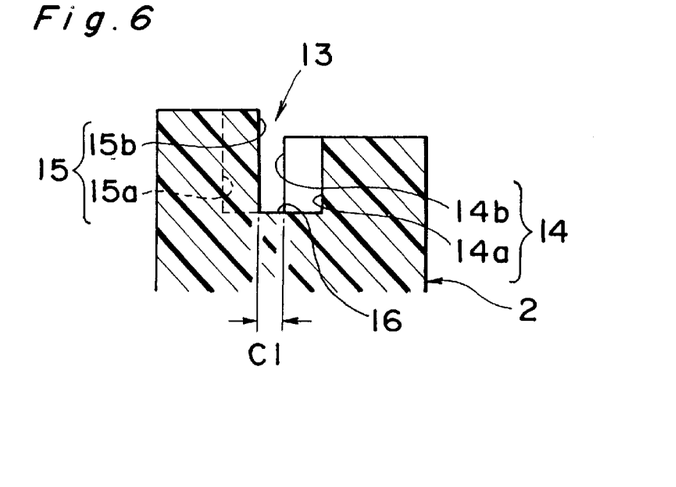
FIG. 6 is an illustrative section taken along the line VI—VI of FIG. 5.
Figure 7:
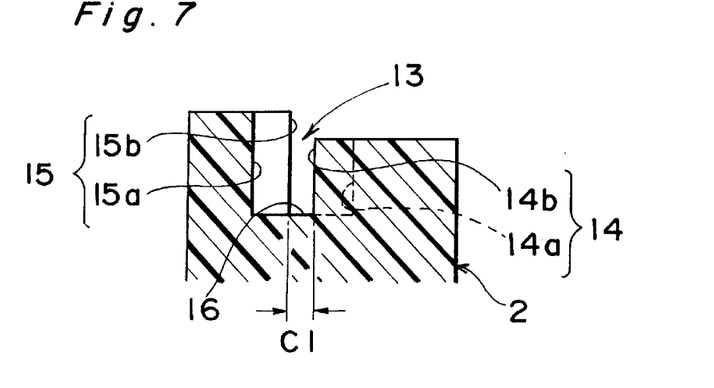
FIG. 7 is an illustrative section taken along the line VII—VII of FIG. 5.
Figure 8:
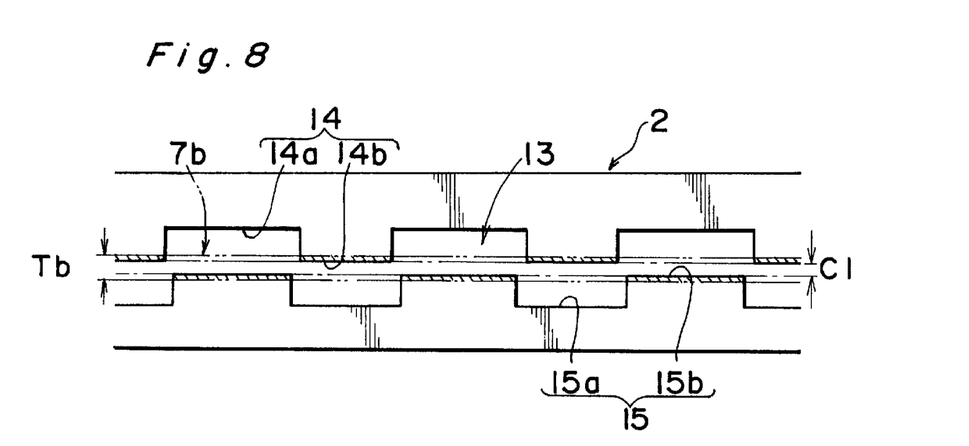
FIG. 8 is an enlarged plan view illustrating the frame of the IC card in accordance with the embodiment 1.

The pair of uneven vertical walls 14, 15 are arranged so that the depressions 14a on the interior vertical wall 14 face the projections 15b on the exterior vertical wall 15 and so that the projections 14b on the interior vertical wall 14 face the depressions 15a on the exterior vertical wall 15. Alternatively, the walls may be arranged so that the depressions 14a and 15a on the uneven vertical walls 14, 15 face each other and so that the projections 14b and 15b face each other.

In this embodiment, the distance C1 between the projections 14b and 15b on the uneven vertical walls 14, 15 in the direction of the width of the frame, i.e., the distance C1 between the imaginary line linking the tops of the projections 14b on the interior vertical wall 14 and the imaginary line linking the tops of the projections 15b on the exterior vertical wall 15, is set so as to be smaller than the thickness Tb of the bend portion 7b by a given amount (for example, C1 is set at 0.1 mm in the case of Tb of 0.15 mm).

The bend portions 7b are press-fitted into the groove 13 along the projections 14b, 15b on the uneven vertical walls 14, 15 and are thereby fixed to the groove 13, so that the metal panel 7 is fixed to the top surface of the frame 2.

More preferably, the bend portions 7b are press-fitted into the groove 13 with use of vibration press-fit method or ultrasonic press-fit method. With use of vibration press-fit method or ultrasonic press-fit method, the bend portions 7b can be press-fitted into the groove 13 while part of resin which constitutes the vertical walls 14, 15 in the groove 13 on the frame 2 (more specifically, the tops of the projections 14b, 15b as shown by hatched portions in FIG. 8) is melted.

The connector 6 and the front sides of the metal panels 7, 8 are bonded and fixed to each other through the medium of adhesive sheets 9; in this arrangement, the adhesive sheets 9, each of which is shaped like a narrow, simple rectangle, are inexpensive and capable of achieving a more stable adhesion with a simpler bonding process, as compared with adhesive sheets shaped like a frame.

In accordance with the embodiment 1, as described above, the grooves 13 each of which comprises a pair of uneven vertical walls 14, 15 having a plurality of depressions 14a, 15a and projections 14b, 15b extending in the direction of the width of the frame are provided along the frame 2 on the top and bottom surfaces of the frame 2. Additionally, the distance C1 between the projections 14b and 15b on both the uneven vertical walls 14, 15 in the direction of the width of the frame is set so as to be smaller than the thickness Tb of the bend portions 7b, 8b of the metal panels 7, 8 by a given amount. The metal panels 7, 8 are fixed to the frame 2 with the bend portions 7b, 8b press-fitted into the grooves 13 along the projections 14b, 15b on the uneven vertical walls 14, 15, so that an extremely firm fixing force can be obtained by the press-fit effect of the bend portions 7b, 8b which acts in the directions of their thicknesses. Thus the metal panels 7, 8 can be firmly fixed to the frame 2.

That is, the embodiment 1 does not require the bonding with use of the frame-like adhesive sheet 109 required for the prior art 1, and therefore provides a more stable fixing force with lower cost. Besides, a fixing force sufficient to withstand a long-term use can be stably obtained as compared with the prior arts 2 to 4 and with the case in which the fixation to the frame is achieved by the press-fit effect of the projections provided on the panel members which effect acts in the direction of the lengths of the projections. In the embodiment, the press-fit margin in the direction of the thickness of the bend portions 7b, 8b is defined by the distance C1 between the projections 14b and 15b on both the uneven vertical walls 14, 15 in the direction of the width of the frame, so that the frame 2 can be produced more readily as compared with the case where the press-fit margin is defined by the width of rectilinear grooves extending along the frame and having not less than a certain degree of length.

In accordance with the embodiment 1, at least one surface (both surfaces, more preferably) of each bend portion 7b, 8b of the metal panels 7, 8 preferably has surface properties of which the surface roughness is not less than a certain degree of roughness, as described above. Thus the increase in frictional resistance resulted from the surface roughness provides a larger fixing force when the bend portions 7b, 8b are press-fitted into the grooves 13.

In accordance with the embodiment 1, the bend portions 7b, 8b are press-fitted into the grooves 13 with use of vibration press-fit method or ultrasonic press-fit method. Accordingly, the bend portions 7b, 8b can be press-fitted into the groove 13 while part of resin which constitutes the vertical walls 14, 15 of the grooves 13 on the frame 2 (more specifically, the tops of the projections 14b, 15b as shown by hatched portions in FIG. 8) is melted. As a result, the bend portions 7b, 8b can be fixed to the groove 13 more reliably and more firmly.

In addition, the control on the accuracy of the press-fit margin by the distance C1 of the grooves 13 relative to the thickness Tb of the bend portions 7b, 8b can be relaxed to a certain extent so that the production of the dies for the grooves 13 of the frame 2 and the molding of the grooves may be simplified, because the bend portions 7b, 8b are press-fitted into the grooves 13 while part of resin which constitutes the vertical walls 14, 15 in the grooves 13 is melted.

Embodiment 2

An embodiment 2 of the invention will be described below. In the following description, the same elements as the embodiment 1 are designated by the same numerals, and further description on the elements is omitted.

Figure 9:
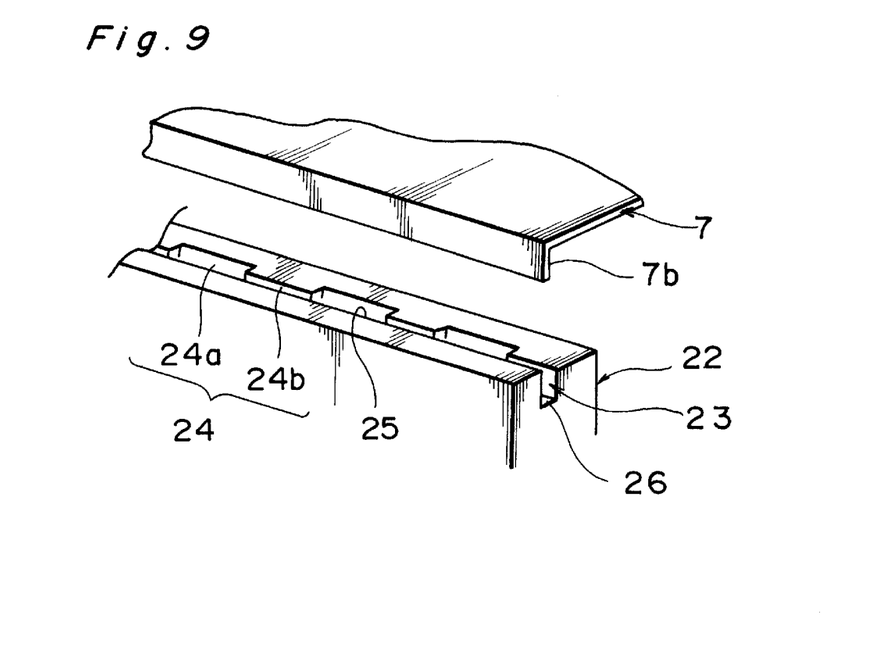
FIG. 9 is an enlarged perspective view illustrating the top surface of a frame and a bend portion of an upper metal panel in an IC card in accordance with an embodiment 2.
Figure 10:
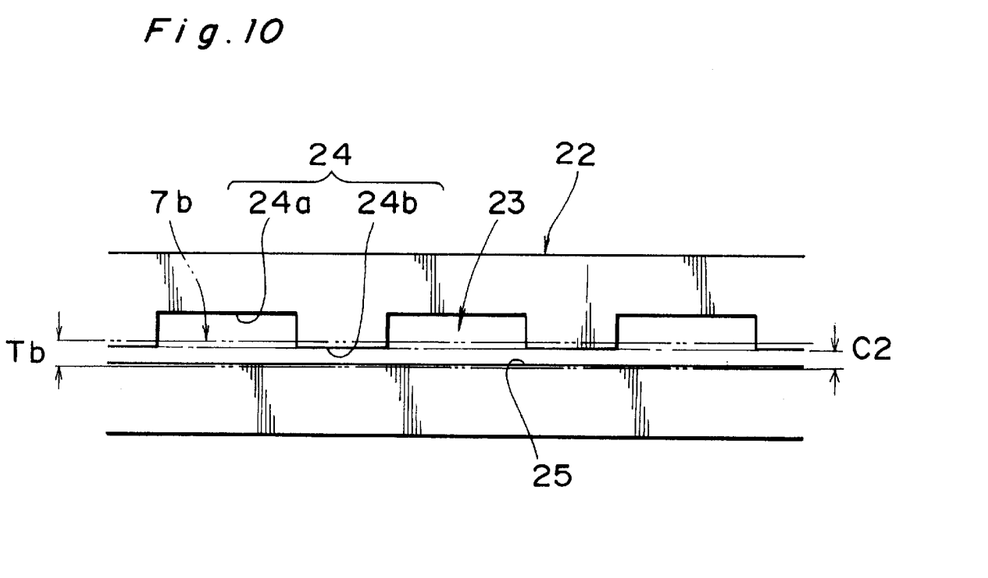
FIG. 10 is an enlarged plan view illustrating the frame of the IC card in accordance with the embodiment 2.

In the embodiment 2, as shown in FIGS. 9 and 10, on the top and bottom surfaces of a frame 22 are provided grooves 23 each comprising an uneven vertical wall 24 having a plurality of depressions 24a and projections 24b extending in the direction of the width of the frame, an even (planar) vertical wall 25 extending in parallel with the frame 22, and a bottom wall 26, which grooves extend along the frame.

The depth of the grooves 23 is so set as to be greater than the height of bend portions 7b of a metal panel 7. The grooves 23 are provided over the whole length of each part of the frame 22, corresponding to the lengths of the bend portions 7b.

In this embodiment, the distance C2 between the projections 24b on the uneven vertical wall 24 and the even vertical wall 25 in the direction of the width of the frame, i.e., the distance C2 between the imaginary line linking the tops of the projections 24b on the interior vertical wall 24 and the exterior vertical wall 25, is set so as to be smaller than the thickness Tb of the bend portion 7b by a given amount (for example, C2 is set at 0.12 mm in the case of Tb of 0.15 mm).

The bend portions 7b are press-fitted between the projections 24b on the uneven vertical wall 24 and the even vertical wall 25 and are thereby fixed to the groove 23, so that the metal panel 7 is fixed to the top surface of the frame 22.

The bend portions 7b are press-fitted into the groove 23, more preferably, with use of vibration press-fit method or ultrasonic press-fit method.

Though FIGS. 9 and 10 illustrate the upper part of the frame 22, the above-mentioned structure of the groove 23 on the frame 22 is more preferably the same as on the lower side of the frame. The metal panel 7 has the same structure as that of the embodiment 1.

In accordance with the embodiment 2, as described above, on the top and bottom surfaces of the frame 22 are provided the grooves 23 each comprising the uneven vertical wall 24 having the plurality of depressions 24a and projections 24b extending in the direction of the width of the frame, and the even (i.e., planar) vertical wall 25 extending in parallel with the frame 22, which grooves extend along the frame. Besides, the distance between the projections 24b on the uneven vertical wall 24 and the even vertical wall 25 is set so as to be smaller than the thickness Tb of the bend portions 7b, 8b of the metal panels 7, 8 by a given amount. The metal panels 7, 8 are fixed to the frame 22 by the press-fit of the bend portions 7b, 8b between the projections 24b on the uneven vertical wall 24 and the even vertical wall 25, so that an extremely large fixing force can be obtained by the press-fit effect of the bend portions 7b, 8b which acts in the directions of the thicknesses thereof. Thus the metal panels 7, 8 can be firmly fixed to the frame 22.

That is, the embodiment 2 does not require the bonding with use of the frame-like adhesive sheet 109 required for the prior art 1, and therefore provides a more stable fixing force with lower cost. Besides, a fixing force sufficient to withstand a long-term use can be stably obtained as compared with the prior arts 2 to 4 and with the case in which the fixation to the frame is achieved by the press-fit effect of the projections provided on the panel members, which effect acts in the directions of the lengths of the projections. In the embodiment, the press-fit margin in the direction of the thickness of the bend portions 7b, 8b is defined by the distance C2 between the projections 24b on the uneven vertical wall 24 and the even vertical wall 25, so that the frame 22 can be produced more readily as compared with the case where the press-fit margin is defined by the width of the rectilinear grooves extending along the frame and having not less than a certain degree of length.

Additionally, one vertical wall 25 in the groove 23 on the frame 22, which wall is even (planar), is positioned on the outer side with respect to the frame 22; this arrangement avoids the unevenness of the gaps between the outsides of the bend portions 7b, 8b and the grooves 23 on the frame 22, in the IC card assembled by the press-fit of the bend portions 7b, 8b of the metal panels 7, 8, and improves the appearance of the card.

Furthermore, the production of the dies for the resin-molding of the frame 22 can be facilitated as compared with the case where both the vertical walls 14, 15 in the groove 13 are uneven as in the embodiment 1.

The basic arrangement of the embodiment 2 is the same as that of the embodiment 1 except that one vertical wall 25 in the groove 23 on the frame 22 is so formed as to be even (planar). Accordingly, the same effects as the embodiment 1 can be achieved, e.g., with regard to the surface roughness of the bend portions 7b, 8b and the use of vibration press-fit method or ultrasonic press-fit method, except for the difference in effect caused by the evenness of one vertical wall 25.

Embodiment 3

An embodiment 3 of the invention will be described below. In the following description, the same elements as the embodiment 1 are designated by the same numerals, and further description on the elements is omitted.

Figure 11:
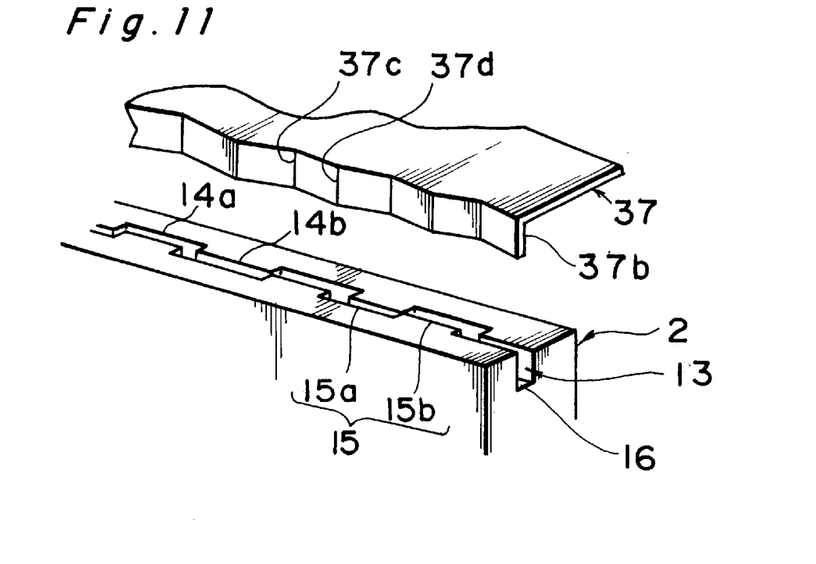
FIG. 11 is an enlarged perspective view illustrating the top surface of a frame and a bend portion of an upper metal panel in an IC card in accordance with an embodiment 3.
Figure 12:
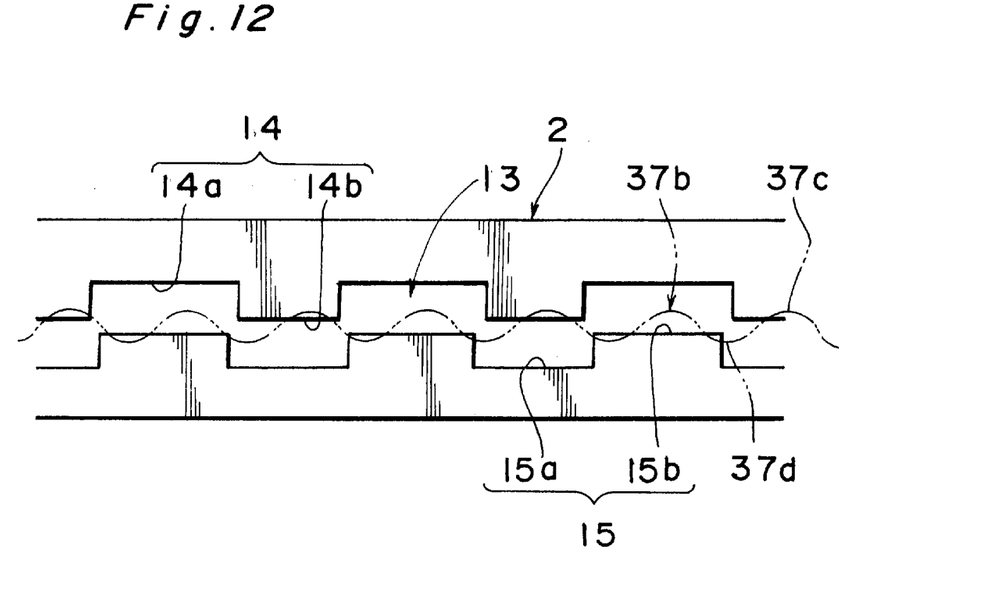
FIG. 12 is an enlarged plan view illustrating the IS frame of the IC card in accordance with the embodiment 3.

In the embodiment 3, as shown in FIGS. 11 and 12, a bend portion 37b of a metal panel 37 is formed so as to be uneven and so as to have depressions 37c and projections 37d extending in a direction orthogonal to the direction of the press-fit, particularly, so as to have a plurality of depressions 37c and projections 37d extending in a direction orthogonal to the direction of the press-fit and ranging in the longitudinal direction of the bend portion 37b.

Though FIGS. 11 and 12 illustrate the upper metal panel 37, such a structure of the metal panel is more preferably the same as that of the lower metal panel. Also, a frame 2 has the same structure as that of the embodiment 1.

As shown in FIG. 12, the bend portions 37b are press-fitted along projections 14b, 15b on uneven vertical walls 14, 15 in the frame 2 and are thereby fixed to a groove 13 as mentioned above, so that the metal panel 37 is fixed to the top surface of the frame 2.

In the embodiment, each bend portion 37b is formed so as to be uneven and so as to have the depressions 37c and projections 37d extending in the direction orthogonal to the direction of the press-fit, and this configuration is capable of producing the same effect as an increase in the thickness of the bend portion 37b. Additionally, use can be made of the elastic force acting in the direction orthogonal to the direction of the press-fit of each bend portion 37b can be utilized, and the force for fixing the bend portions 37b to the grooves 13 on the frame 2 can be further increased.

In particular, each bend portion 37b is formed so as to be uneven and so as to have the plurality of depressions 37c and projections 37d extending in the direction orthogonal to the direction of the press-fit and ranging in the longitudinal direction of the bend portion 37b, and the bend portions 37b thus can be press-fitted into the groove 13 on the frame smoothly and reliably with a smaller pressure.

The basic arrangement of the embodiment 3 is the same as that of the embodiment 1 except that the bend portions 37b of the metal panel 37 are so formed as to be uneven. Accordingly, the embodiment 3 achieves basically the same effects as the embodiment 1, and also the above-mentioned effect of the unevenness of the bend portions 37b can be acheived additionally.

In the embodiment 3, the metal panel 37 of which the bend portions 37b are so formed as to be uneven is applied to the same frame 2 as used in the embodiment 1; however, the metal panel 37 may be applied to the same frame 22 as used in the embodiment 2.

Embodiment 4

Figure 13:
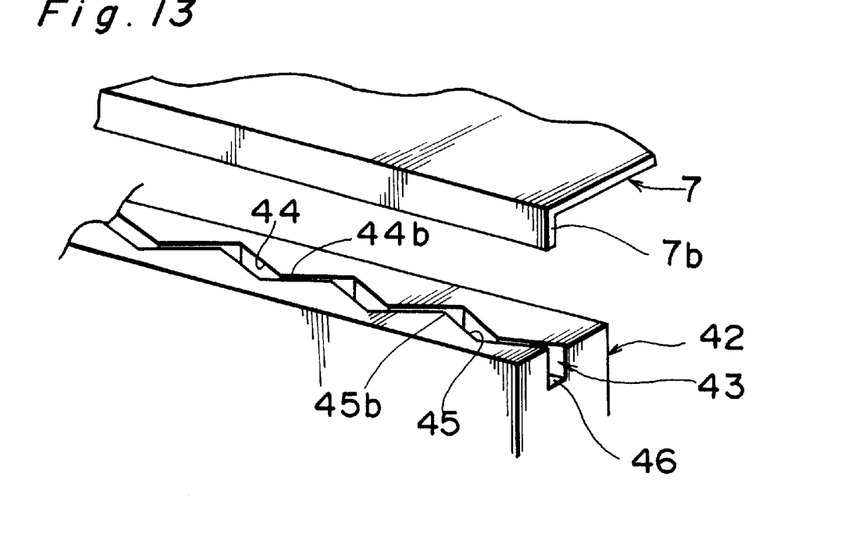
FIG. 13 is an enlarged perspective view illustrating the top surface of a frame and a bend portion of an upper metal panel in an IC card in accordance with an embodiment 4.
Figure 14:
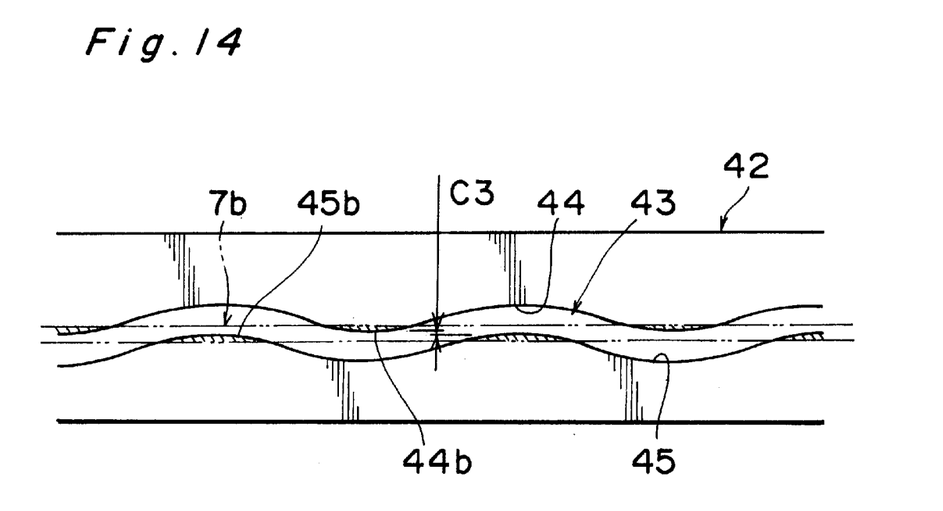
FIG. 14 is an enlarged plan view illustrating the frame of the IC card in accordance with the embodiment 4.
Figure 15:
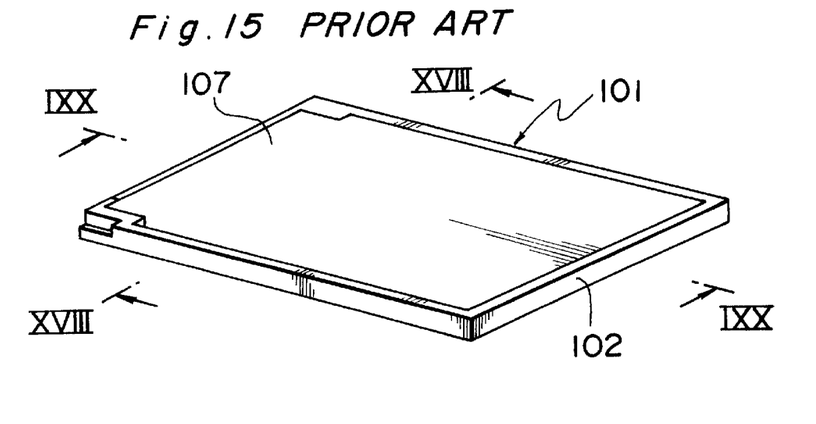
FIG. 15 is a perspective view illustrating an IC card in accordance with a prior art 1.
Figure 16:
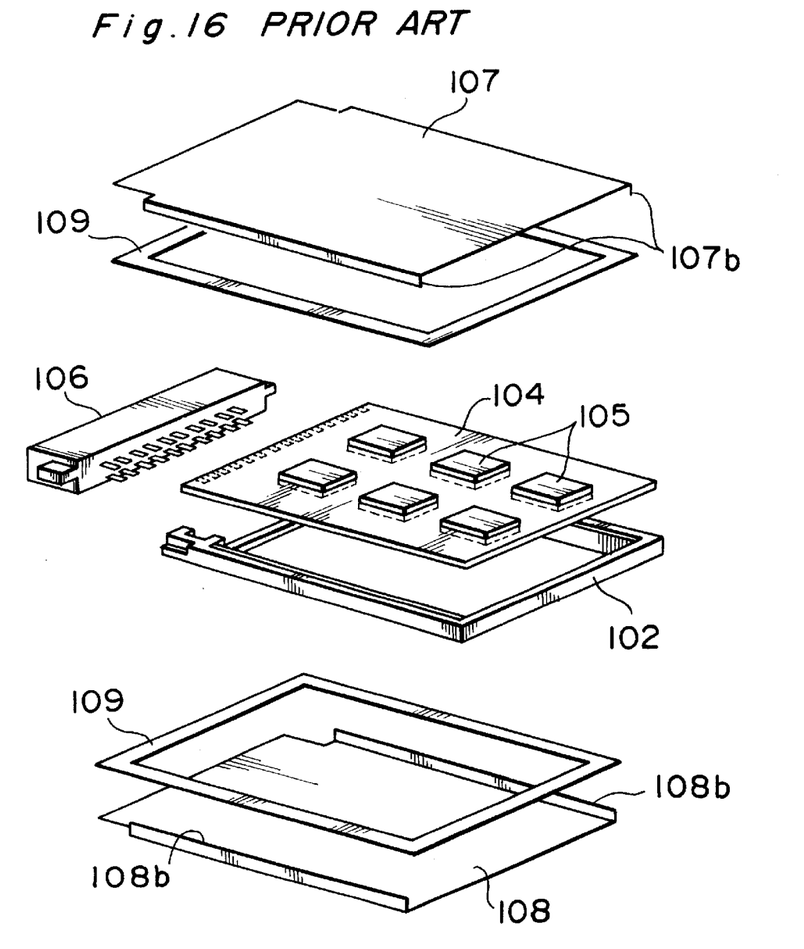
FIG. 16 is an exploded view in perspective illustrating the IC card in accordance with the prior art 1.
Figure 17:
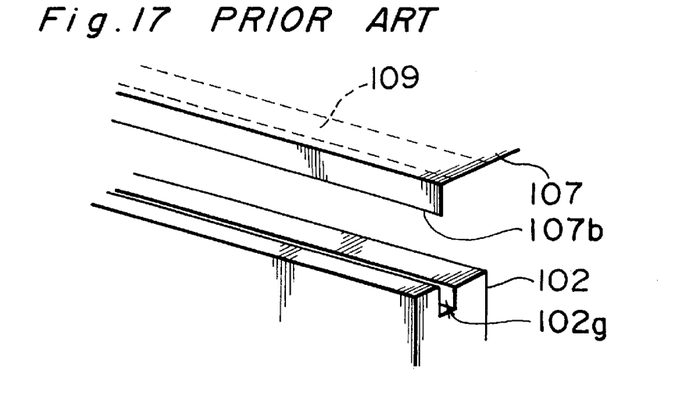
FIG. 17 is an enlarged perspective view illustrating the top surface of a frame and a bend portion of an upper metal panel in the IC card in accordance with the prior art 1.
Figure 18:
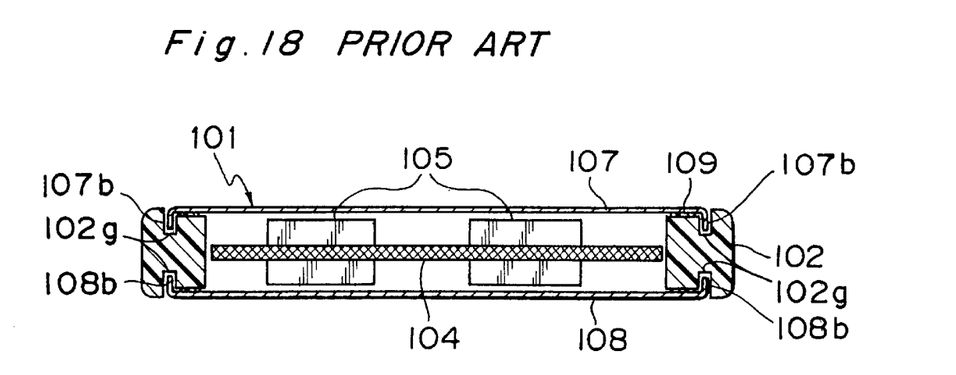
FIG. 18 is an illustrative section taken along the line XVIII—XVIII of FIG. 15.
Figure 19:
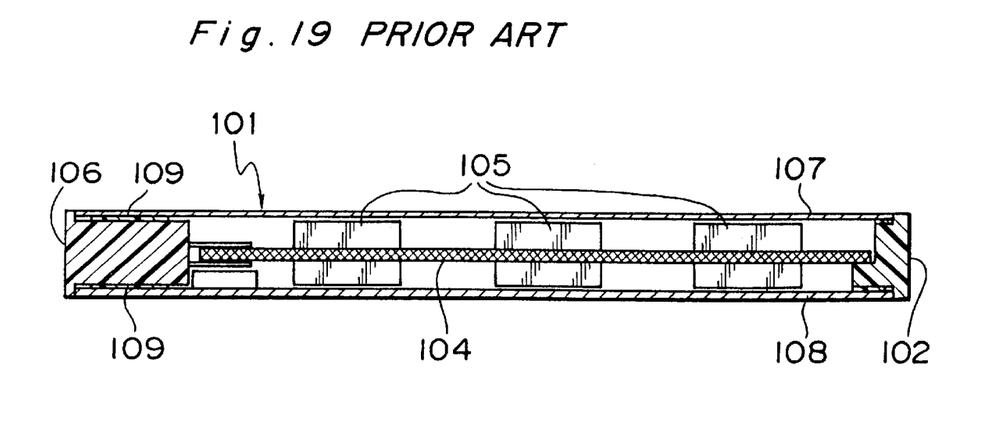
FIG. 19 is an illustrative section taken along the line IXX—IXX of FIG. 15.
Figure 20:
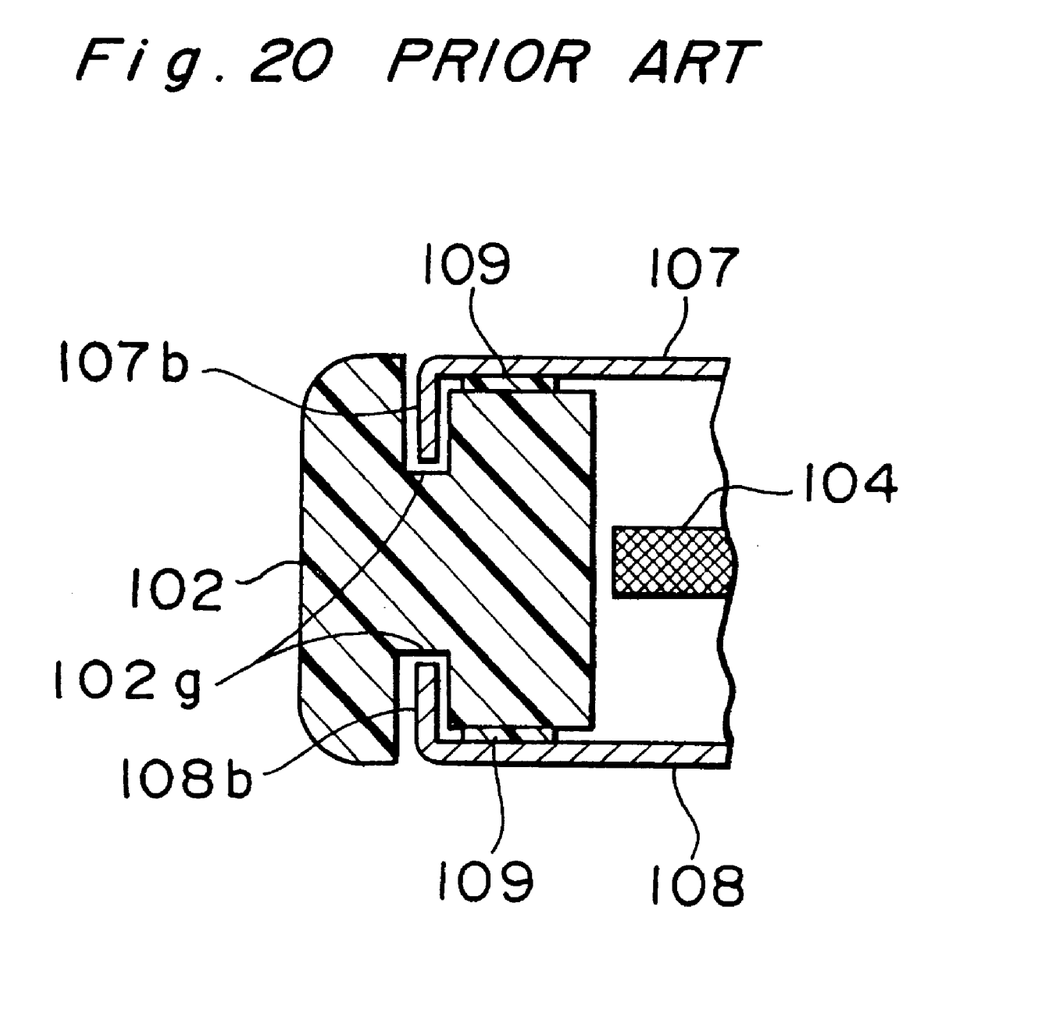
FIG. 20 is an enlarged section illustrating the IC card in accordance with the prior art 1 in which metal panels have been fixed to the frame.

An embodiment 4 of the invention will be described below. In the embodiment 4, as shown in FIGS. 13 and 14, on the top and bottom surfaces of a frame 42 are provided grooves 43 each of which comprises a pair of corrugated vertical walls 44, 45 having an amplitude in the direction of the width of the frame, and a bottom wall 46 and which extend along the frame 42.

The depth of the grooves 43 is so set as to be greater than the height of bend portions 7b of a metal panel 7. The grooves 43 are provided over the whole length of each part of the frame 42, corresponding to the lengths of the bend portions 7b.

In this embodiment, the distance C3 between tops 44b and 45b of the corrugated vertical walls 44, 45 in the direction of the width of the frame is set so as to be smaller than the thickness Tb of the bend portions 7b of the metal panel 7 by a given amount.

In the embodiment, for example, the distance C3 is set in the vicinity of 0 mm in the case of the thickness Tb of the bend portions 7b of 0.15 mm, on the premise that vibration press-fit method or ultrasonic press-fit method is applied to the press-fit of the bend portions 7b into the grooves 43. The distance C3 is to be set at an appropriate value according to the method of press-fitting, the gentleness of the corrugation of the vertical walls 44, 45, and the like.

The bend portions 7b are press-fitted along the tops 44b, 45b of the corrugated vertical walls 44, 45 with use of vibration press-fit method or ultrasonic press-fit method, so as to be fixed to the grooves 43. The metal panel 7 is thus fixed to the top surface of the frame 42.

Though FIGS. 13 and 14 illustrate the upper part of the frame 42, the above-mentioned structure of the grooves 43 on the frame 42 is more preferably the same as that on the lower side of the frame. The metal panel 7 has the same structure as that of the embodiment 1.

In accordance with the embodiment 4, as described above, on the top and bottom surfaces of the frame 42 are provided the grooves 43 each comprising the pair of corrugated vertical walls 44, 45 having the amplitude in the direction of the width of the frame, which grooves extend along the frame. Besides, the distance C3 between the tops 44b and 45b of the corrugated vertical walls 44, 45 in the direction of the width of the frame is set so as to be smaller than the thickness Tb of the bend portions 7b, 8b of the metal panels 7, 8 by a given amount. The metal panels 7, 8 are fixed to the frame 42 by the press-fit of the bend portions 7b, 8b along the tops 44b and 45b of the corrugated vertical walls 44, 45, so that an extremely large fixing force can be obtained by the press-fit effect of the bend portions 7b, 8b which acts in the directions of the thicknesses the bend portions. Thus the metal panels 7, 8 can be firmly fixed to the frame 42.

That is, the embodiment 4 does not require the bonding with use of the frame-like adhesive sheet 109 required for the prior art 1, and therefore provides a more stable fixing force with lower cost. Besides, a fixing force sufficient to withstand a long-term use can be stably obtained as compared with the prior arts 2 to 4 and with the case in which the fixation to the frame is achieved by the press-fit effect of the projections provided on the panel members, which effect acts in the directions of the lengths of the projections. In the embodiment, the press-fit margin in the direction of the thickness of the bend portions 7b, 8b is defined by the distance C3 between the tops 44b and 45b of the corrugated vertical walls 44, 45 of the grooves 43 in the direction of the width of the frame, so that the frame can be produced more readily as compared with the case where the press-fit margin is defined by the width of rectilinear grooves extending along the frame and having not less than a certain degree of length.

In the case of the frame 42 molded of resin, the die of the frame can be produced readily as compared with the case where the vertical walls in the grooves are angular and uneven. Besides, the moldability can be improved because the width of the grooves 43 can be set uniformly.

The basic arrangement of the embodiment 4 is the same as that of the embodiment 1 except that the vertical walls 44, 45 in the grooves 43 on the frame 42 are so formed as to be corrugated. Accordingly, the same effects as the embodiment 1 can be achieved, e.g., with regard to the surface roughness of the bend portions 7b, 8b or the use of vibration press-fit method or ultrasonic press-fit method, except for the difference in effect caused by the corrugation of the vertical walls 44, 45.

The present invention is not limited to the above embodiments but it goes without saying that various modifications, various changes in the design, or the like may be made without departing from the spirit of the present invention.

What is claimed is:

1. An IC card in which a pair of, upper and lower panel members covering plane portions of the card are respectively fixed to the top and bottom surfaces of a frame forming the exterior of the card, the IC card characterized in that the panel members are provided with bend portions which are formed of edge portions of the panel members bent generally by 90 degrees; that grooves each of which comprises a pair of uneven vertical walls having a plurality of depressions and projections extending in the direction of the width of the frame are provided along the frame on the top and bottom surfaces of the frame; that the distance between the projections on both the uneven vertical walls in the direction of the width of the frame is set so as to be smaller than the thickness of the bend portions by a given amount; and that the panel members are fixed to the frame by the press-fit of the bend portions into the grooves along the projections on the uneven vertical walls.

2. An IC card as claimed in claim 1, wherein each bend portion is formed so as to be uneven and so as to have depressions and projections extending in a direction orthogonal to the direction of the press-fit.

3. An IC card as claimed in claim 2, wherein each bend portion is formed so as to be uneven and so as to have a plurality of depressions and projections extending in a direction orthogonal to the direction of the press-fit and ranging in the longitudinal direction of the bend portion.

4. An IC card as claimed in claim 1, wherein at least one surface of each bend portion of the panel members has surface properties of which the surface roughness is not less than a certain degree of roughness.

5. An IC card as claimed in claim 1, wherein the frame is made of resin and wherein the bend portions of the panel members are press-fitted into and fixed to the frame by vibration press-fit method or ultrasonic press-fit method.

6. An IC card in which a pair of, upper and lower panel members covering plane portions of the card are respectively fixed to the top and bottom surfaces of a resin frame forming the exterior of the card, the IC card characterized in that the panel members are provided with bend portions which are formed of edge portions of the panel members bent generally by 90 degrees; that on the top and bottom surfaces of the frame are provided grooves each of which comprises an uneven vertical wall having a plurality of depressions and projections extending in the direction of the width of the frame, and comprises an even vertical wall extending in parallel with the frame, and which grooves extend along the frame; that the distance between the projections on the uneven vertical wall and the even vertical wall is set so as to be smaller than the thickness of the bend portions by a given amount; and that the panel members are fixed to the frame by the press-fit of the bend portions between the projections on the uneven vertical wall and the even vertical wall.

7. An IC card as claimed in claim 6, wherein each bend portion is formed so as to be uneven and so as to have depressions and projections extending in a direction orthogonal to the direction of the press-fit.

8. An IC card as claimed in claim 7, wherein each bend portion is formed so as to be uneven and so as to have a plurality of depressions and projections extending in a direction orthogonal to the direction of the press-fit and ranging in the longitudinal direction of the bend portion.

9. An IC card as claimed in claim 6, wherein at least one surface of each bend portion of the panel members has surface properties of which the surface roughness is not less than a certain degree of roughness.

10. An IC card as claimed in claim 6, wherein the frame is made of resin and wherein the bend portions of the panel members are press-fitted into and fixed to the frame by vibration press-fit method or ultrasonic press-fit method.

11. An IC card in which a pair of, upper and lower panel members covering the plane portions of the card are respectively fixed to the top and bottom surfaces of a resin frame forming the exterior of the card, the IC card characterized in that the panel members are provided with bend portions which are formed of edge portions of the panel members bent generally by 90 degrees; that on the top and bottom surfaces of the frame are provided grooves each comprising a pair of corrugated vertical walls having an amplitude in the direction of the width of the frame, which grooves extend along the frame; that the distance between the tops of both the corrugated vertical walls in the direction of the width of the frame is set so as to be smaller than the thickness of the bend portions by a given amount; and that the panel members are fixed to the frame by the press-fit of the bend portions into the grooves along the tops of the corrugated vertical walls.

12. An IC card as claimed in claim 11, wherein at least one surface of each bend portion of the panel members has surface properties of which the surface roughness is not less than a certain degree of roughness.

13. An IC card as claimed in claim 11, wherein the frame is made of resin and wherein the bend portions of the panel members are press-fitted into and fixed to the frame by vibration press-fit method or ultrasonic press-fit method.

* * * * *